United States Patent
Olsen et al.

(10) Patent No.: US 7,846,793 B2
(45) Date of Patent: Dec. 7, 2010

(54) PLASMA SURFACE TREATMENT FOR SI AND METAL NANOCRYSTAL NUCLEATION

(75) Inventors: Christopher S. Olsen, Fremont, CA (US); Sean Seutter, San Jose, CA (US); Ming Li, Watervliet, NY (US); Phillip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 399 days.

(21) Appl. No.: 11/866,625

(22) Filed: Oct. 3, 2007

(65) Prior Publication Data
US 2009/0090952 A1   Apr. 9, 2009

(51) Int. Cl.
*H01L 21/336* (2006.01)
*H01L 21/3105* (2006.01)
*H01L 21/4757* (2006.01)

(52) U.S. Cl. .............. 438/260; 438/710; 438/723; 438/783

(58) Field of Classification Search ........ 438/513, 438/798, 788, 260, 264
See application file for complete search history.

(56) References Cited

U.S. PATENT DOCUMENTS

| | | | |
|---|---|---|---|
| 5,714,766 A * | 2/1998 | Chen et al. .............. 257/17 |
| 6,090,666 A * | 7/2000 | Ueda et al. ............. 438/257 |
| 6,344,403 B1 | 2/2002 | Madhukar et al. | |
| 6,400,610 B1 * | 6/2002 | Sadd .................. 365/185.29 |
| 6,518,617 B1 * | 2/2003 | Nakamura et al. ......... 257/314 |
| 6,656,792 B2 | 12/2003 | Choi et al. | |
| 6,660,659 B1 | 12/2003 | Kraus et al. | |
| 6,984,842 B1 * | 1/2006 | Nayfeh et al. ............ 257/14 |
| 7,074,676 B2 * | 7/2006 | Iwata et al. ............. 438/260 |
| 7,179,754 B2 | 2/2007 | Kraus et al. | |
| 2002/0153160 A1 * | 10/2002 | Hofmann et al. ......... 174/117 F |
| 2002/0190343 A1 * | 12/2002 | Jones et al. ............ 257/500 |
| 2003/0132432 A1 * | 7/2003 | Yoshii et al. ........... 257/17 |
| 2004/0038486 A1 * | 2/2004 | Chua et al. ............ 438/287 |
| 2004/0130941 A1 * | 7/2004 | Kan et al. ............. 365/177 |
| 2004/0242021 A1 * | 12/2004 | Kraus et al. ............ 438/776 |
| 2005/0090062 A1 * | 4/2005 | Wang ................ 438/264 |
| 2005/0095786 A1 * | 5/2005 | Chang et al. ........... 438/260 |
| 2005/0258470 A1 * | 11/2005 | Lojek et al. ............ 257/315 |
| 2006/0003531 A1 * | 1/2006 | Chang et al. ........... 438/264 |
| 2006/0009043 A1 * | 1/2006 | Cho et al. ............. 438/763 |
| 2006/0019469 A1 | 1/2006 | Panayil et al. | |

(Continued)

OTHER PUBLICATIONS

Cubaynes, Ultra-thin plasma nitrided oxide gate dielectrics for advanced MOS transistors, University of Twente Publications, 2004, 188 pages.*

(Continued)

*Primary Examiner*—David Vu
*Assistant Examiner*—Earl N Taylor
(74) *Attorney, Agent, or Firm*—Patterson & Sheridan, LLP (57) ABSTRACT

A device, such as a nonvolatile memory device, and methods for forming the device in an integrated process tool are provided. The method includes depositing a tunnel oxide layer on a substrate, exposing the tunnel oxide layer to a plasma so that the plasma alters a morphology of a surface and near surface of the tunnel oxide to form a plasma altered near surface. Nanocrystals are then deposited on the altered surface of the tunnel oxide.

19 Claims, 6 Drawing Sheets

U.S. PATENT DOCUMENTS

| | | | |
|---|---|---|---|
| 2006/0029747 A1* | 2/2006 | Cruse et al. | 427/569 |
| 2006/0110865 A1* | 5/2006 | Liu et al. | 438/151 |
| 2006/0110883 A1* | 5/2006 | Min | 438/260 |
| 2006/0118853 A1* | 6/2006 | Takata et al. | 257/314 |
| 2006/0121673 A1* | 6/2006 | Lojek | 438/257 |
| 2006/0166452 A1* | 7/2006 | Rao et al. | 438/369 |
| 2006/0216944 A1* | 9/2006 | Kraus et al. | 438/758 |
| 2006/0261401 A1* | 11/2006 | Bhattacharyya | 257/316 |
| 2006/0270158 A1* | 11/2006 | Chang et al. | 438/257 |
| 2006/0284241 A1* | 12/2006 | Kim | 257/316 |
| 2007/0014151 A1* | 1/2007 | Zhang et al. | 365/185.01 |
| 2007/0015360 A1 | 1/2007 | Lu et al. | |
| 2007/0054502 A1* | 3/2007 | Seol et al. | 438/782 |
| 2007/0064478 A1* | 3/2007 | Zhang et al. | 365/185.01 |
| 2007/0085130 A1* | 4/2007 | Wang | 257/314 |
| 2007/0093013 A1* | 4/2007 | Chua et al. | 438/197 |
| 2007/0176225 A1* | 8/2007 | Lee et al. | 257/315 |
| 2007/0209930 A1* | 9/2007 | Chua et al. | 204/298.02 |
| 2007/0212895 A1* | 9/2007 | Chua et al. | 438/758 |
| 2007/0212896 A1* | 9/2007 | Olsen et al. | 438/758 |
| 2007/0218623 A1* | 9/2007 | Chua et al. | 438/240 |
| 2007/0249121 A1* | 10/2007 | Kao et al. | 438/264 |

OTHER PUBLICATIONS

Kraus et al., Further optimization of plasma nitridation of ultra-thin oxides for 65-nm node MOSFETS, Semiconductor Fabtech, $23^{rd}$ edition, Aug. 2004, 5 pages.*

Kraus et al., Model to Predict Gate Tunneling Current of Plasma Oxynitrides, IEEE Transactions on Electron Devices, vol. 52, No. 6, Jun. 2005, 7 pages.*

Chang "Silicon Nanocrystal Memory-Physics and Technology," MRS Spring Meeting, Apr. 18, 2006, Freescale Semiconductor, Inc., Slides 1-39.

Schroeder, et al. "Effects of atomic hydrogen on the selective area growth of Si and $Si_{1-x}Ge_x$ thin films on Si and $SiO_2$ surfaces: Inhibition, nucleation, and growth," J. Vac. Sci. Technol. A, vol. 22, No. 3, May/Jun. 2004, pp. 580-593.

Notification of the First Office Action for Chinese Patent Application No. 200810168235.6 (APPM/010836 CN) dated Oct. 30, 2009.

Notice to File a Response dated Aug. 11, 2010 for Korean Patent Application No. 10-2008-0097156.

Liu, et al. "Metal Nanocrystal Memories - Part I: Device Design and Fabrication," IEEE Transactions on Electron Devices, vol. 49, No. 9, pp. 1606-1613, Sep. 2002.

Perera, et al. "Effects of post annealing on removal of defect states in silicon oxynitride films grown by oxidation of silicon substrates nitrided in inductively coupled nitrogen plasma," Thin Solid Films, vol. 423, pp. 212-217, 2003.

* cited by examiner

PLASMA SURFACE TREATMENT FOR SI AND METAL NANOCRYSTAL NUCLEATION

BACKGROUND OF THE INVENTION

1. Field of the Invention

Embodiments of the present invention generally relate to semiconductor devices, methods for forming semiconductor devices, and semiconductor devices used as non-volatile memory devices.

2. Description of the Related Art

Flash memory has been widely used as non-volatile memory for a wide range of electronic applications, such as mobile phones, personal digital assistants (PDAs), digital cameras, MP3 players, USB devices, and the like. As flash memory is typically used for portable recording devices to store large amounts of information, a reduction in power consumption and cell sizes, along with increased operational speed, is very desirable.

Flash memory devices typically include a floating gate electrode on a tunneling oxide for storing an electrical charge and a fairly thick dielectric oxide surrounding to contain the charge. Nanocrystals have been suggested to replace the floating gate electrode on the tunneling oxide in order to reduce the needed thickness of the oxide surrounding. However, there remains a need for a method to obtain a more efficiently and uniform deposition of the nanocrystals on the tunneling oxide.

SUMMARY OF THE INVENTION

An apparatus and methods for forming a device in an integrated process tool are provided. In one embodiment, a method includes depositing a tunnel oxide layer on a substrate, exposing the tunnel oxide layer to a plasma so that the plasma alters a morphology of a surface and near surface of the tunnel oxide to form an altered surface, and depositing nanocrystals on the altered surface of the tunnel oxide. An encapsulating dielectric material may then be deposited, followed by the deposition of a control gate material on the substrate. Similarly if multiple layers of nanocrystals are to be formed, the bottom part of the encapsulating dielectric may be treated before the next layer of nanocrystals is deposited. The tunnel oxide layer may be deposited to a thickness between about 2 nm and about 10 nm, and the plasma altered near surface may have a thickness between about 0.5 nm and about 2 nm. The plasma altered near surface may be formed by exposing the tunnel oxide layer to a plasma by applying an RF field to a plasma gas while maintaining a plasma ion energy less than about 30 eV. In one embodiment, the plasma ion energy may be about 5 eV to about 15 eV. In one embodiment, the plasma altered near surface has a thickness of about 1 nm.

In another embodiment, a method of fabricating a non-volatile memory device includes depositing a tunnel oxide layer on a substrate, exposing the tunnel oxide layer to a plasma by applying an RF field to a plasma gas while maintaining a plasma potential less than about 10 V, so that the plasma alters a morphology of a surface and near surface of the tunnel oxide. The method further includes depositing at least one of silicon nanocrystals, silicon germanium nanocrystals, and metal nanocrystals on the altered surface of the tunnel oxide, depositing an encapsulating dielectric material on the substrate, depositing a control gate material the substrate, and annealing the substrate before at least one of the depositing nanocrystals and the depositing an encapsulating dielectric material.

In another embodiment, a non-volatile memory device is provided. The device includes a substrate, a tunnel oxide layer having a thickness between about 2 nm and about 10 nm deposited on the substrate, in which a near surface region of the tunnel oxide layer includes plasma treated tunnel oxide having a thickness between about 0.5 nm and 2.0 nm, at least one of silicon nanocrystals, silicon germanium nanocrystals, and metal nanocrystals disposed on the near surface region, an encapsulating dielectric material disposed over the at least one of silicon nanocrystals and metal nanocrystals, and a control gate material disposed over the encapsulating dielectric material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A device, such as a nonvolatile memory device, and methods for forming the device in an integrated process tool are provided. The method includes depositing a tunnel oxide layer on a substrate, exposing the tunnel oxide layer to a plasma so that the plasma alters the morphology of a surface and near surface of the tunnel oxide to form a plasma altered near surface. Nanocrystals are then deposited on the altered surface of the tunnel oxide.

Figure 1:
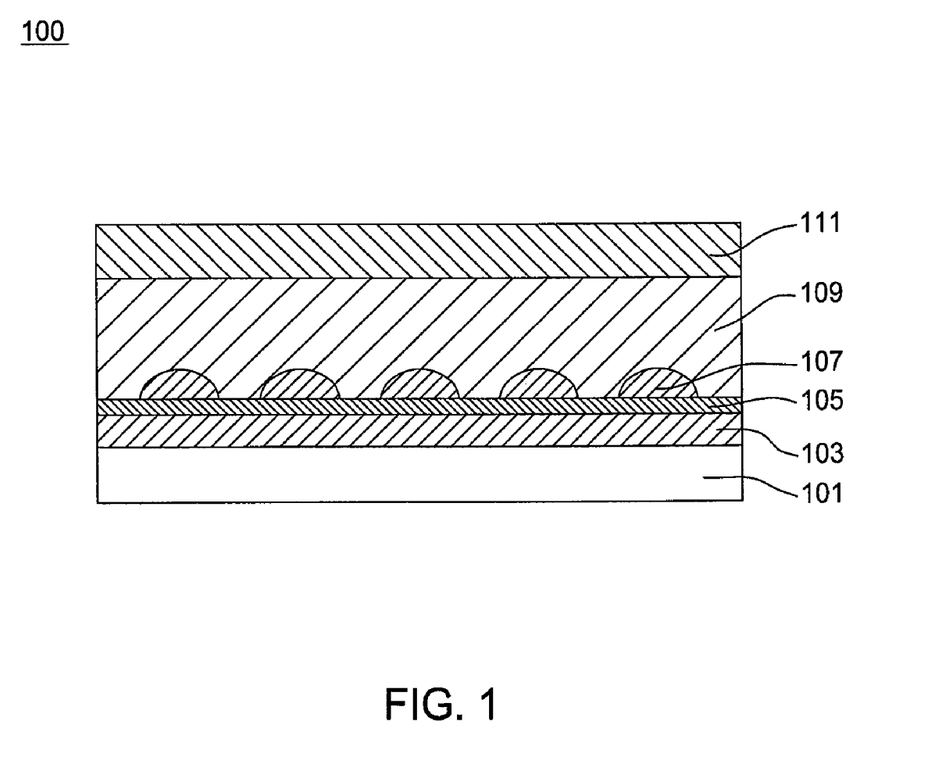
FIG. 1 depicts a two dimensional block diagram of a segment of a flash memory cell according to one embodiment of the present invention.

FIG. 1 depicts a two dimensional block diagram of a segment of a flash memory cell 100 according to one embodiment of the invention. Cell 100 may include a substrate 101 onto which a tunnel oxide layer 103 may be disposed. The tunnel oxide layer 103 may include a plasma treated near surface region 105. Silicon based, silicon germanium based, or metal based nanocrystals 107 may be disposed on the plasma treated near surface region 105. The nanocrystals 107 may be encapsulated by an encapsulating dielectric layer 109. A control gate 111 may be disposed above the encapsulating dielectric 109.

Figure 2:
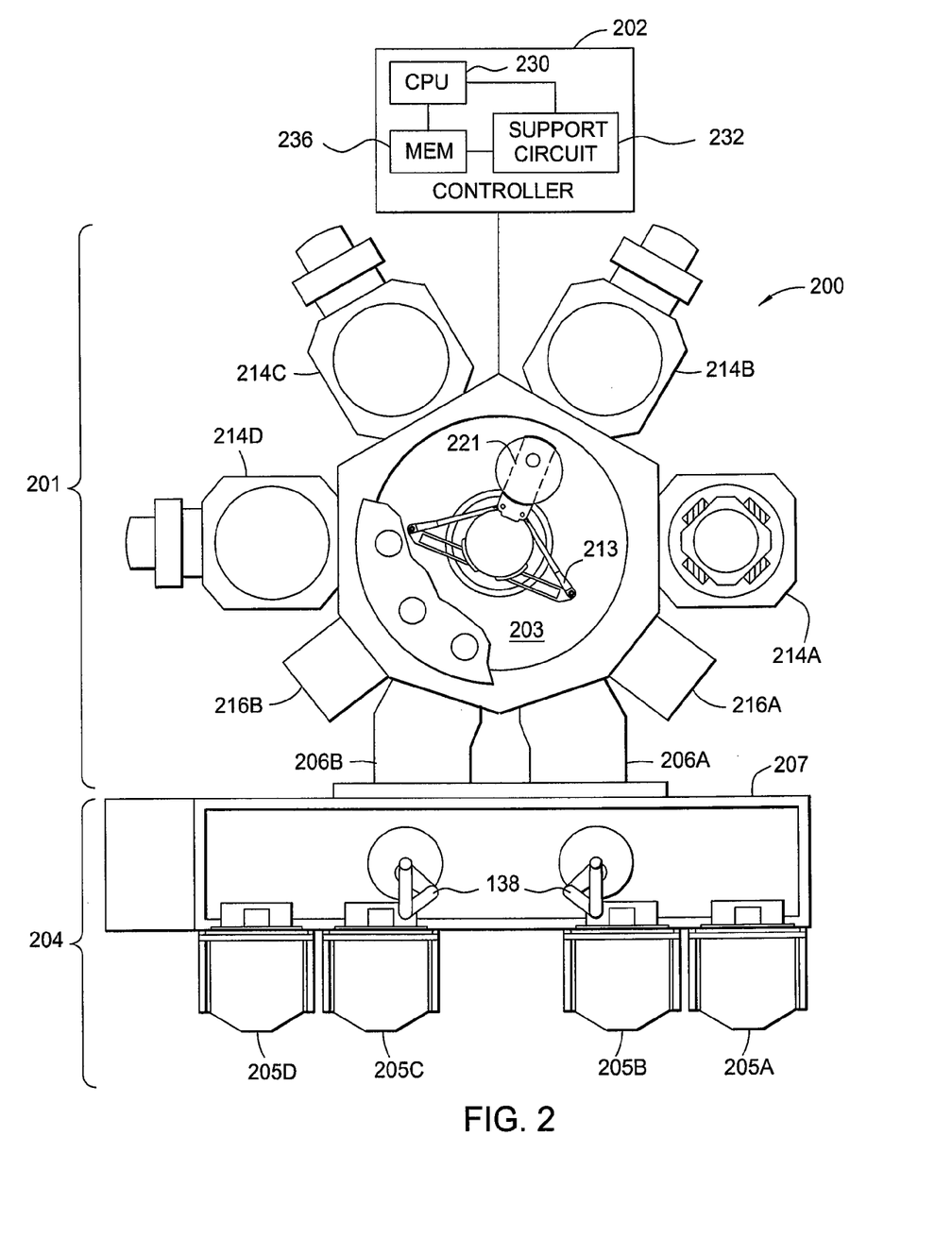
FIG. 2 depicts a schematic plan view of an exemplary integrated semiconductor substrate processing system that may be used to practice one embodiment of the present invention.

FIG. 2 depicts a schematic plan view of an exemplary integrated semiconductor substrate processing system 200 that may be configured to practice one embodiment of the present invention. Examples of the integrated system 200 show modification of the, CENTURA® integrate tool, available from Applied Materials, Inc., of Santa Clara, Calif. It is contemplated that the methods described herein may be practiced in other tools having the requisite process chambers coupled thereto, such as PRODUCER® and ENDURA® integrated tools or tools available from other manufacturers.

The processing system 200 includes a vacuum-tight processing platform 201, a factory interface 204, and a system controller 202. The platform 201 comprises a plurality of processing chambers 214A-D and load lock chambers 206A-B, which are coupled to a vacuum substrate transfer chamber 203. The factory interface 204 is coupled to the transfer chamber 203 by the load lock chambers 206A-B.

In certain embodiments, the factory interface 204 comprises at least one docking station 207 and at least one factory interface robot 138 to facilitate transfer of substrates. The docking station 207 is configured to accept one or more front opening unified pod (FOUP). Four FOUPS 205A-D are shown in the embodiment of FIG. 2. The factory interface robot 138 is configured to transfer the substrate from the factory interface 204 to the processing platform 201 for processing through the load lock chambers 206A-B.

Each of the load lock chambers 206A-B have a first port coupled to the factory interface 204 and a second port coupled to the transfer chamber 203. The load lock chambers 206A-B are coupled to a pressure control system (not shown) which pumps down and vents the chambers 206A-B to facilitate passing the substrate between the vacuum environment of the transfer chamber 203 and the substantially ambient (e.g., atmospheric) environment of the factory interface 204.

The transfer chamber 203 has a vacuum robot 213 disposed therein. The vacuum robot 213 is capable of transferring substrates 221 between the load lock chamber 206A-B and the processing chambers 214A-D. In certain embodiments, the transfer chamber 203 may include a cool down station built therein to facilitate cooling down the substrate 221 while transferring a substrate 221 in the system 200.

In certain embodiments, the processing chambers 214A-D coupled to the transfer chamber 203 may include chemical vapor deposition (CVD) chambers 214A-B, a plasma chamber 214C (such as a Decoupled Plasma Nitridation (DPN) chamber), and a Rapid Thermal Process (RTP) chamber 214D. The CVD chambers 214A-B may include different types of CVD chambers, such as a thermal chemical vapor deposition (Thermal-CVD) process, low pressure chemical vapor deposition (LPCVD), metal-organic chemical vapor deposition (MOCVD), plasma enhanced chemical vapor deposition (PECVD), sub-atmosphere chemical vapor deposition (SACVD), and the like. Alternatively, different processing chambers, including at least one atomic layer deposition (ALD), CVD, physical vapor deposition (PVD), DPN, or RTP chamber, may be interchangeably incorporated into the system 200 in accordance with process requirements. Suitable ALD, CVD, PVD, DPN, RTP, and MOCVD processing chambers are available from Applied Materials, Inc., among other manufacturers.

In certain embodiments, an optional service chamber (shown as 216A-B) may be coupled to the transfer chamber 203. The service chambers 216A-B may be configured to perform other substrate processes, such as degassing, orientation, pre-cleaning process, cool down, and the like.

The system controller 202 is coupled to the system 200. The system controller 202 controls the operation of the system 200 using a direct control of the process chambers 214A-D of the system 200 or alternatively, by controlling the computers (or controllers) associated with the process chambers 214A-D and system 200. The system controller 202 may comprise a CPU 230, a memory storage device 236, and a support circuit 232. In operation, the system controller 202 enables data collection and feedback from the respective chambers and system 200 to enhance performance of the system 200.

Figure 3:
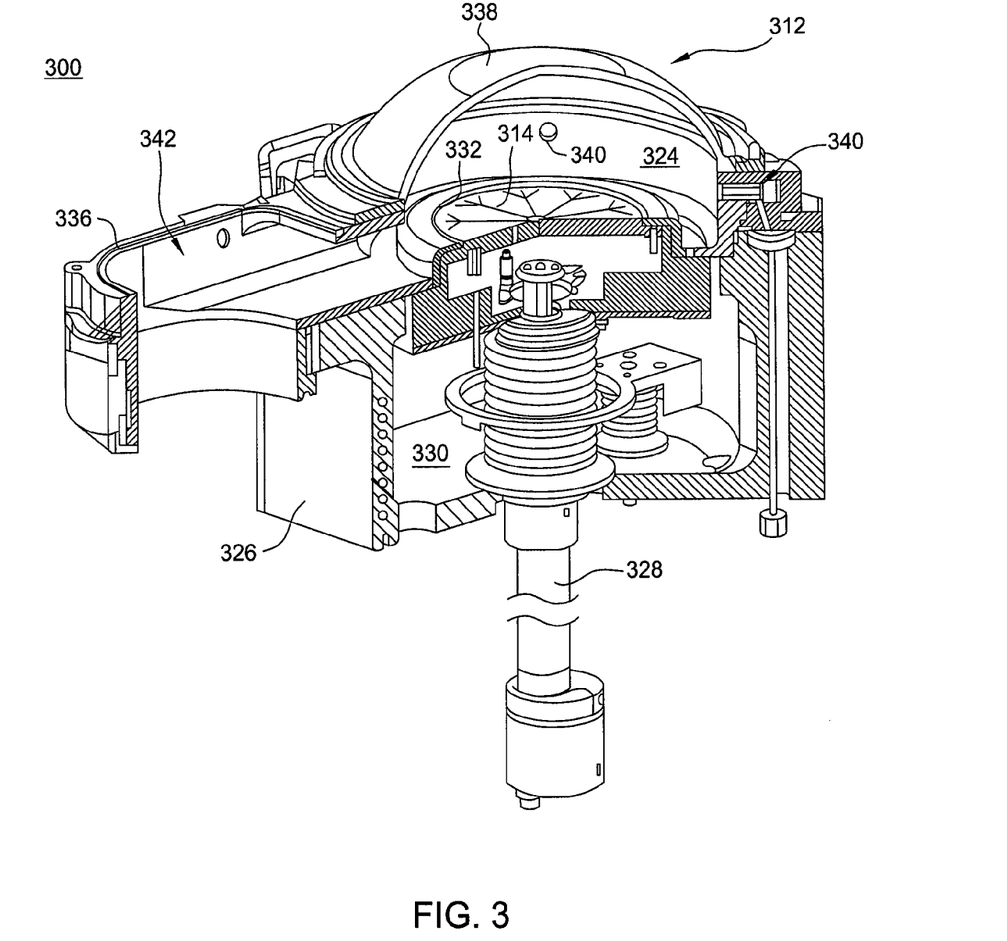
FIG. 3 depicts a schematic plan view of an exemplary plasma chamber that may be used to practice one embodiment of the present invention.
Figure 4:
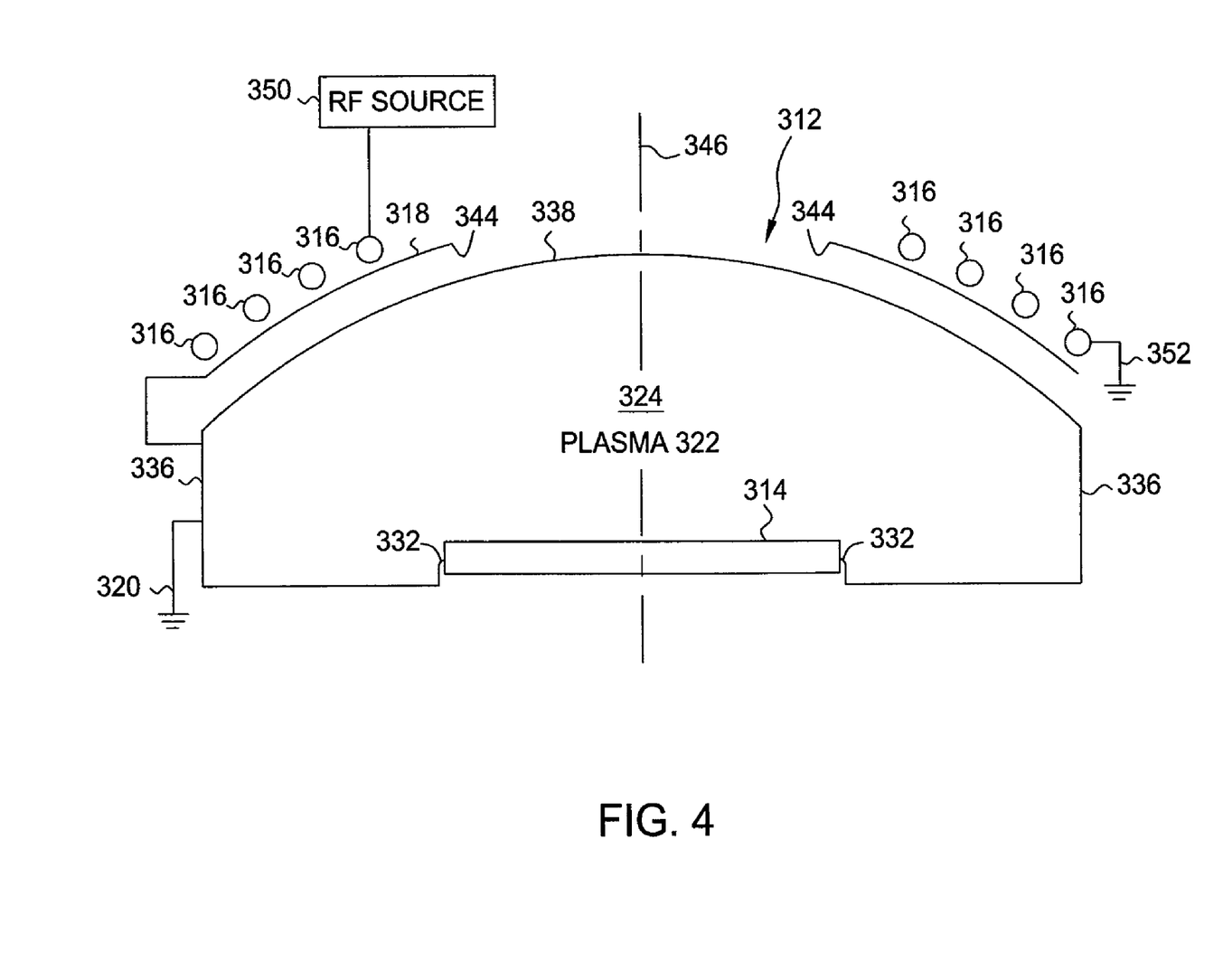
FIG. 4 depicts another schematic plan view of the plasma chamber of FIG. 3.

FIGS. 3 and 4 depict a plasma chamber 300, such as a DPN chamber, according to an embodiment of the invention. Plasma chamber 300 includes a chamber 312, a substrate holder 314, an RF coil 316, and an electrode plate 318. The electrode plate 318 is connected through a body of the chamber 312 to ground 320. By grounding the electrode plate 318, a capacitive coupling between the RF coil 316 and a plasma 322 in an internal volume 324 of the chamber 312 is eliminated. The elimination of the capacitive coupling reduces the potential of the plasma 322 without dramatically altering other properties of the plasma 322, such as ion density and electron density. The inductive coupling from the RF coil 316 is not eliminated, and this coupling creates and maintains the plasma 322.

Referring specifically to FIG. 3, the plasma chamber 300 further includes a lower transfer chamber 326 and a transfer mechanism 328. The chamber 312 is positioned on top of the transfer chamber 326. An internal volume 330 of the transfer chamber 326 is placed in communication with the internal volume 324 of the chamber 312 through a circular opening 332 in a base of the chamber 312. The substrate holder 314 is secured on top of the transfer mechanism 328, and the transfer mechanism 328 can be used to elevate or lower the substrate holder 314.

In use, the transfer mechanism 328 is operated so that the substrate holder 314 is lowered into the internal volume 330 of the transfer chamber 326. A substrate, positioned on a blade attached to a robot arm, is then transferred through a slit-valve opening in a wall of the transfer chamber 326 into the internal volume 330. The transfer mechanism 328 is then operated to elevate the substrate holder 314 so that the substrate holder 314 contacts a lower surface of the substrate and elevates the substrate off the blade. The blade is then removed from the transfer chamber 326, whereafter the transfer mechanism 328 is again operated to elevate the substrate holder 314 into the opening 332. The substrate, located on the substrate holder 314, then has an upper surface which is exposed to the internal volume 324 of the chamber 312.

The chamber 312 includes primarily a conductive body 336 and a dielectric quartz upper wall 338. The conductive body 336 forms a lower portion of the chamber 312, and the upper wall 338 forms an upper portion of the chamber 312. The conductive body 336 and the upper wall 338 jointly define the internal volume 324.

Four gas nozzle ports 340 are formed through the conductive body 336 into the internal volume 324. The gas nozzle ports 340 are positioned at 90 degree intervals around the substrate holder 314. The conductive body 336 also defines a vacuum pumping channel 342 on one side thereof. The gas nozzle ports 340 are connected through valves to a gas manifold, and the vacuum pumping channel 342 is connected to a pump. When the pump is operated, gases are extracted from the internal volume 324 through the vacuum pumping channel 342 to reduce a pressure within the internal volume 324. The valves can be operated to allow gases from the manifold through the valves and the gas nozzle ports 340 into the internal volume 324.

Referring more specifically to FIG. 4, the upper wall 338 has a dome shape, and the electrode plate 318 has a dome shape that conforms to an outer surface of the upper wall 338. The electrode plate 318 may be located directly on the upper wall 338. The electrode plate 318 defines a circular opening 344 over a center of the upper wall 338. The upper wall 338 and the electrode plate 318 are symmetrical around a vertical axis 346.

The coil 316 spirals around the vertical axis 346 and the opening 344. The coil 316 is positioned on and conforms to the dome shape of the electrode plate 318. One end of the coil 316 is connected to an RF source 350, and an opposing end of the coil 316 is connected to ground 352.

Figure 5:
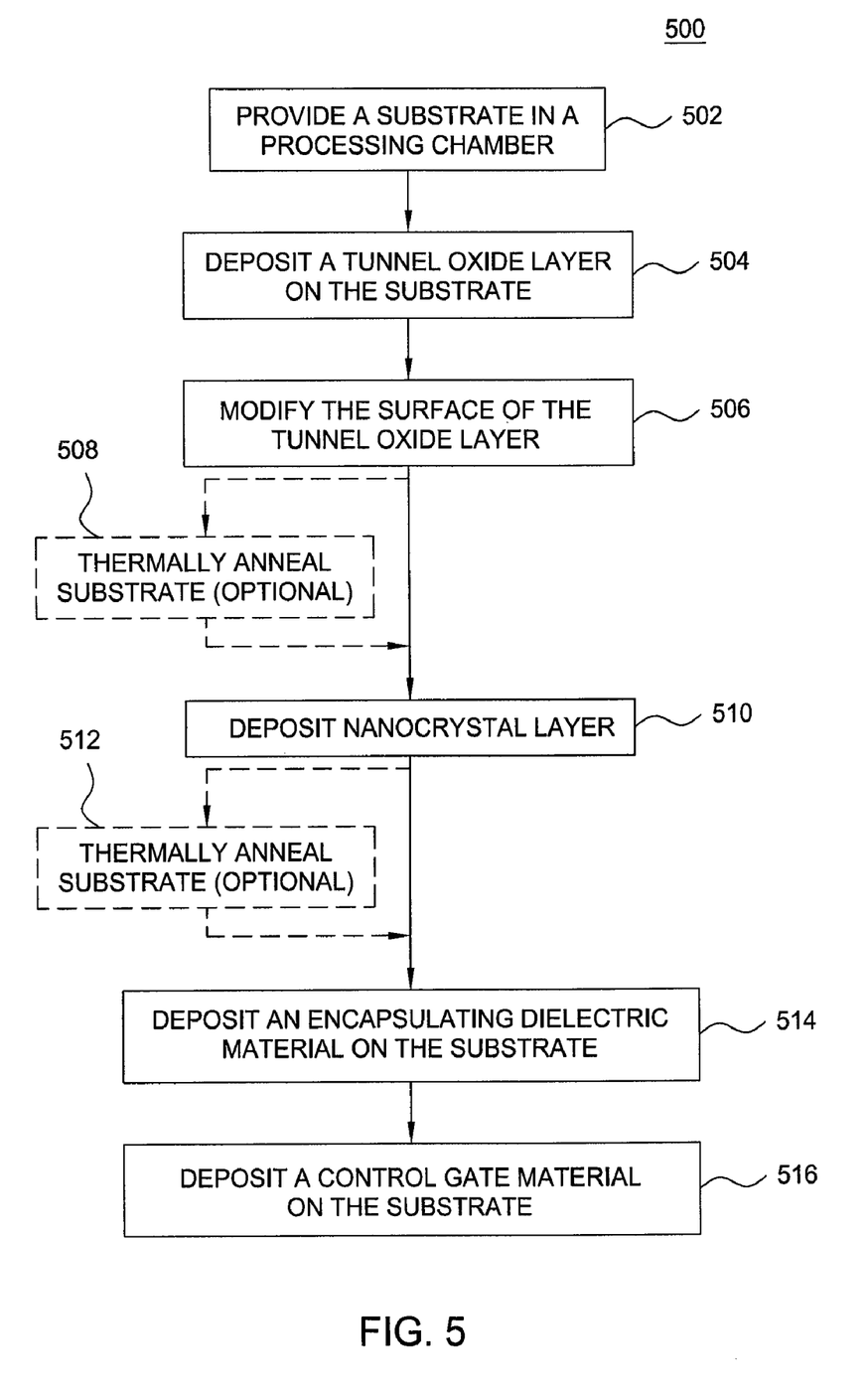
FIG. 5 depicts a process flow diagram of a deposition process according to one embodiment of the present invention.

FIG. 5 depicts a process flow diagram of a deposition process 500 according to certain embodiments of the present invention. It is also contemplated that the process 500 may be performed in other tools, including those from other manufacturers. FIGS. 6A-6E depicts schematic cross-sectional views of a substrate structure in accordance with certain embodiments of the present invention.

Figure 6A:
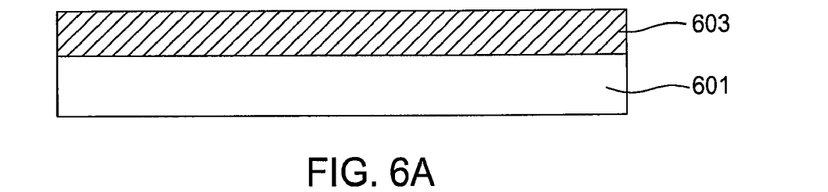
FIGS. 6A-6E depict schematic cross-sectional views of a substrate structure in accordance with one embodiment of the invention.

The method 500 begins at step 502 by providing a substrate 601 to a processing chamber, such as processing chamber 214A integrated into the system 200 described above. The substrate 601 refers to any substrate or material surface upon which film processing is performed. For example, the substrate 601 may be a material such as crystalline silicon (e.g., Si<100> or Si<111>), silicon oxide, strained silicon, silicon germanium, doped or undoped polysilicon, doped or undoped silicon, and patterned or non-patterned wafers, silicon on insulator (SOI), carbon doped silicon oxides, silicon nitride, germanium, gallium arsenide, glass, sapphire or other suitable workpieces. The substrate 601 may have various dimensions, such as 200 mm diameter, 300 mm diameter, or 450 mm diameter, as well as, rectangular or square panels. Unless otherwise noted, embodiments and examples described herein are conducted on substrates with a 200 mm diameter, a 300 mm diameter, or a 450 mm diameter.

Figure 6B:
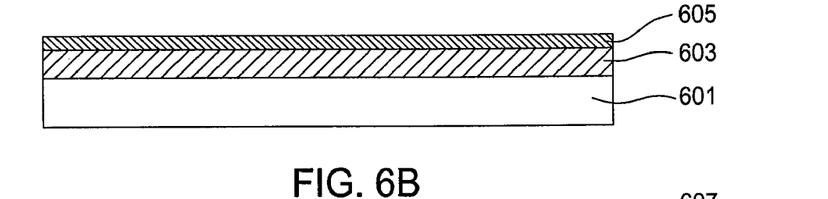

At step 504, a tunnel oxide layer 603 is formed on the substrate 601. The tunnel oxide layer 603 may be formed by any suitable process. In certain embodiments, the tunnel oxide layer 603 comprises $SiO_2$ which may be grown using a reduced pressure RTP chamber such as the XE, XE Plus, or RADIANCE™ RTP chamber available from Applied Materials, Inc., located in Santa Clara, Calif. The $SiO_2$ film may be formed by a rapid thermal oxidation, which is an oxidation process where the chamber uses lamps to quickly heat and dry a substrate surface to form an oxidized layer in the presence of oxygen. The rapid thermal oxidation of a silicon substrate (or a wafer) is carried out using a dry process rapid thermal oxidation with the presence of $O_2$, $O_2+N_2$, $O_2+Ar$, $N_2O$, or $N_2O+N_2$ gas mixtures. The gas or gas mixtures may have a total flow rate of about 1 slm—about 5 slm. Alternatively, the rapid thermal oxidation of a silicon substrate may be carried out using a wet process such as In-Situ Steam Generation (ISSG) with the presence of $O_2+H_2$, $O_2+H_2+N_2$, or $N_2O+H_2$ having, for example, a total flow rate of about 1 slm—about 5 slm with 1-13% $H_2$. In certain embodiments, the rapid thermal oxidation process used to form the $SiO_2$ dielectric film may be performed at a processing temperature of about 750 degrees Celsius—about 1000 degrees Celsius and a processing pressure of about 0.5 Torr—about 50 Torr for about 5 seconds—about 90 seconds which results in a $SiO_2$ dielectric film having a thickness in between about 25 nm and about 10 nm. In one embodiment, the thickness may be from about 4 nm to about 8 nm.

In certain embodiments, the tunnel oxide material may be deposited on the substrate 601 by exposing the substrate to at least one deposition gas during a deposition process. In certain embodiments, the deposition process may be a CVD process having a deposition gas that may contain a silicon precursor and an oxygen precursor or a precursor containing both silicon and oxygen sources. Alternatively, the deposition process may be an ALD process having at least two deposition gases, such that, the substrate is sequentially exposed to a silicon precursor and an oxygen precursor. In certain embodiments, at step 504, the oxygen precursor and the silicon precursor may be introduced into the process chamber or exposed to substrate 601 simultaneously, such as during a traditional CVD process or sequentially, such as during an ALD process.

Examples of suitable oxygen precursors for forming silicon oxide materials during step 504 include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In certain embodiments, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. In one embodiment, a molar ratio of ozone to water may be within a range from about 0.01 to about 30. In another embodiment, the molar ratio may be from about 0.03 to about 3. In another embodiment, the molar ratio may be from about 0.1 to about 1.

Examples of suitable silicon precursors for forming silicon oxide materials during step 504 include silanes, alkylsilanes, halosilanes, alkoxysilanes, aminosilanes, aminodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tertbutylamino)silane (BTBAS or $(tBu(H)N)_2SiH_2$), tetraethoxysilane ($(EtO)_4Si$ or TEOS), hexachlorodisilane (HCD or $Si_2Cl_6$), tetrachlorosilane ($SiCl_4$), dichlorosilane ($H_2SiCl_2$), 1,2-diethyl-tetrakis(diethylamino) disilane $((CH_2CH_3((CH_3CH_2)_2N)_2Si)_2)$, 1,2-dichloro-tetrakis(diethylamino) disilane $((Cl((CH_3CH_2)_2N)_2Si)_2)$, hexakis(N-pyrrolidinio) disilane $(((C_4H_9N)_3Si)_2)$, 1,1,2,2-tetrachloro-bis(di(trimethyl silyl)amino) disilane, $((Cl_2((CH_3)_3Si)_2N)Si)_2)$, 1,1,2,2-tetrachloro-bis(diisopropylamino) disilane, $((Cl_2((C_3H_7)_2N)Si)_2)$, 1,2-dimethyltetrakis(diethylamino) disilane $((CH_3(CH_3CH_2N)_2Si)_2)$, tris(dimethylamino)silane azide $(((CH_3)_2N)_3SiN_3)$, tris(methylamino)silane azide $(((CH_3)(H)N)_3SiN_3)$, 2,2-dimethylhydrazine-dimethylsilane $((CH_3)_2(H)Si)(H)NN(CH_3)_2)$, trisilylamine $((SiH_3)_3N$ or TSA), and hexakis(ethylamino)disilane $(((EtHN)_3Si)_2)$, radicals thereof, plasmas thereof, derivatives thereof, or combinations thereof.

In certain embodiments, an alkoxysilane compound is used as the silicon precursors for forming silicon oxide materials during step 504. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane ($(EtO)_4Si$ or TEOS), tetramethoxysilane ($(MeO)_4Si$), tetrapropoxysilane ($(PrO)_4Si$), tetraisopropoxysilane ($(iPrO)_4Si$), tetrabutoxysilane ($(BuO)_4Si$), triethoxysilane ($(EtO)_3SiH$), diethoxysilane ($(EtO)_2SiH_2$), diethoxydimethylsilane ($(EtO)_2SiMe_2$), diethoxydiethylsilane ($(EtO)_2SiEt_2$), dimethoxydiethoxysilane ($(MeO)_2Si(OEt)_2$), derivatives thereof, or combinations thereof. In another embodiment, an alkoxysilane compound (e.g., TEOS) may be used as a source for both silicon and oxygen, instead of separate silicon and oxygen precursors, to form a silicon oxide material during step 504.

As the silicon precursor and the oxygen precursor may be combined in the process chamber, a silicon-containing material, such as a silicon oxide material, is formed on the substrate surface. In certain embodiments, the silicon oxide material may be deposited at a rate within a range from about 1 nm/min to about 50 nm/min and to a thickness within a range from about 1 nm to about 10 nm. In one embodiment, the thickness may be from about 4 nm to about 8 nm. Silicon oxide materials may have a chemical formula such as $Si_xO_y$, wherein an oxygen:silicon atomic ratio (y/X) is about 2 or less, for example, $SiO_2$.

A carrier gas may be provided during step 504 to control the partial pressure of the oxygen precursor and the silicon precursor. The total internal pressure of a single wafer process chamber may be at a pressure within a range from about 100 mTorr to about 740 Torr. In one embodiment, the pressure may be from about 250 mTorr to about 100 Torr. In another embodiment, the pressure may be from about 500 mTorr to about 50 Torr. In one embodiment, the internal pressure of the process chamber is maintained at a pressure of about 10 Torr or less. In another embodiment, the pressure may be about 5 Torr or less. In another embodiment, the pressure may be about 1 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

In step 506 the tunnel oxide layer 603 may have its surface altered by a plasma treatment process to form the plasma treated near surface region 605. Step 506 may be performed in a plasma chamber, such as the CENTURA™ DPN chamber, available from Applied Materials, Inc., located in Santa Clara, Calif. The plasma treatment process exposes the tunnel oxide layer 603 to a plasma and alters the chemical and/or physical morphology of the top layer of the tunnel oxide layer 603, resulting in optimization of the surface nucleation sites for silicon or metal nanocrystal formation on the near surface region 605.

Referring to FIGS. 3 and 4, the plasma may be created by first reducing the pressure within the internal volume 324 to a predetermined level. A plasma gas is then introduced into the internal volume 324. The plasma gas may, for example, consist of inert gases such as argon (Ar), helium (He), neon (Ne), xenon (Xe), or combinations thereof. Using inert gases may result in physical morphology changes to the surface of the tunnel oxide layer 603. In another embodiment the plasma gas may include reactive gases such as oxygen ($O_2$), nitrogen ($N_2$), ammonia ($NH_3$), nitric oxide (NO), nitrous oxide ($N_2O$), nitrogen trifluoride ($NF_3$), fluorine ($F_2$), combinations thereof, or combinations thereof with inert gases such as Ar, He, Ne, or Xe. Using the reactive gases may result in not only physical morphology changes but also chemical morphology changes to the surface of the tunnel oxide layer 603.

After the introduction of the plasma gas, the RF source 350 may then be operated to provide RF current to the coil 316 at a frequency of 13.56 MHz. The RF coil 316 generates an RF field which is spread by an electrode plate across the upper wall of the chamber. The circular opening permits the RF field to enter through the upper wall of the chamber into the internal volume 324. The RF field then couples with the plasma gas in the internal volume 324. In one embodiment, a pulsed RF field may be applied. The RF field initially excites a small number of free electrons. The free electrons then collide with other atoms to release more electrons from these atoms. The process is continued until a steady-state condition is achieved, where the plasma 322 has a steady amount of free electrons and free ions, a steady electron temperature, and a constant voltage relative to ground. A "reservoir" of ions is created within the internal volume 324, and the voltage potential of the plasma 322 assists in incorporating ions from this reservoir into the silicon dioxide layer. The potential of the substrate and the substrate holder 314 floats freely during the entire process, but there is a difference in the voltage of the plasma 322 and that of the substrate holder 314. The difference drives the incorporation of the ions.

Without grounding the electrode plate 318, the RF coil 316 couples capacitively to the plasma 322. Such a capacitive couple between the RF coil 316 and the plasma 322 increases the voltage of the plasma 322. Conversely, by grounding the electrode plate 318, the capacitive coupling is substantially reduced, and the voltage of the plasma 322 is reduced. The plasma potential and the electron temperature are reduced, but ion density remains relatively high. To prevent excessive modification of the tunnel oxide surface, and to prevent incorporation of, for example, nitrogen through the tunnel oxide layer and into the silicon substrate, the plasma potential may be maintained at less than 10 V. Electron temperatures may be near or less than 2 eV. Ion density may be at least $10^{10}$ cm$^{-3}$. Ion energy may be less than about 15 eV, for example, less than about 5 eV.

The inert plasma process proceeds for a time period from about 10 seconds to about 5 minutes. In one embodiment, the time period may be from about 30 seconds to about 4 minutes. In another embodiment, the time period may be from about 1 minute to about 3 minutes. Also, the plasma process is conducted at a plasma power setting within a range from about 100 watts to about 3,000 watts. In one embodiment, the power setting may be from about 700 watts to about 2,500 watts. In another embodiment, the power setting may be from about 900 watts to about 1,800 watts. Generally, the plasma process may be conducted with a duty cycle of about 50 percent to about 100 percent and a pulse frequency at about 10 kHz. The chamber may have a pressure of between about 10 mTorr and about 80 mTorr. The plasma gas may have a flow rate of between about 10 standard cubic centimeters per minute (sccm) and about 1 standard liter per minute (slm). In one embodiment, the flow rate may be between about 50 sccm and about 750 sccm. In another embodiment, the flow rate may be from about 100 sccm to about 500 sccm.

The conversion of the surface of the tunnel oxide layer 603 by the plasma process in step 506 results in the formation of the plasma treated near surface region 605. The plasma treated near surface region may have a thickness between about 0.5 nm and about 2 nm. In one embodiment, the thickness is about 1 nm. The near surface modification of the tunnel oxide layer 603 makes a minimal impact on the tunneling characteristics of the tunnel oxide layer 603 in order to achieve beneficial charge retention lifetimes of the devices while at the same time allowing for the optimization of surface nucleation sites for nanocrystal formation. The optimization of surface nucleation as a result of the plasma process may be due at least in part to a change in the surface energy of the $SiO_2$ tunnel oxide surface. Normally, $SiO_2$ has a surface energy of 1.5 J/m$^2$. In comparison, platinum has a surface energy of 2.5 J/m$^2$ and Ru has a surface energy of 2.3 J/m$^2$, which are common metals considered for nanocrystal flash. The density at which the metal atoms coalesce into hemispheres on the $SiO_2$ surface may therefore be controlled by changing the physical and chemical morphology of the $SiO_2$ surface using the techniques disclosed herein. Other metals such as Gold at 1.1 J/m$^2$, Aluminum at 0.87 J/m$^2$, and Copper at 1.3 J/m$^2$, may not coalesce on untreated SiO$_2$ because their surface energy is lower than SiO$_2$. Titanium at 1.65 J/m$^2$ and Palladium at 1.55 J/m$^2$ are just barely above SiO$_2$ surface energy, so these may not coalesce on the surface of SiO$_2$.

In optional step 508, a post plasma modification anneal may be performed. The anneal may be performed in RTP chamber 300 where the substrate is subjected to a temperature of between about 500 degrees Celsius and about 1,200 degrees Celsius. In one embodiment, the temperature may be between about 900 degrees Celsius and about 1,100 degrees Celsius. In one embodiment, the substrate temperature may be maintained at less than about 600 degrees Celsius. The anneal may occur for a time period between about 1 second and about 240 seconds. In one embodiment, the time period may be between about 30 seconds and about 90 seconds. In one embodiment, anneal may be performed at about 1,000 degrees Celsius for about 60 seconds. Generally, the RTP anneal chamber atmosphere contains at least one anneal gas, such as O$_2$, N$_2$, NH$_3$, N$_2$H$_4$, NO, N$_2$O, or combinations thereof. The anneal chamber may be maintained at a pressure from about 5 Torr to about 100 Torr. In one embodiment, the pressure may be about 50 Torr.

Figure 6C:
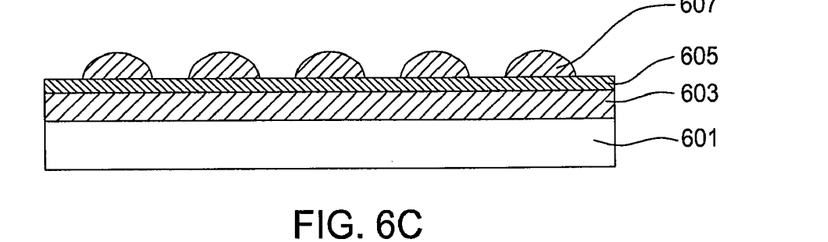

In step 510 the silicon, silicon germanium, or metal nanocrystals 607 are deposited on top of the near surface region 605. In one embodiment, a layer of silicon, silicon germanium, or metallic nanocrystals may be formed by a PVD process, an ALD process, a CVD process, an electroless deposition process, an ECP process, or combinations thereof. The silicon, silicon germanium, or metal layer may be deposited to a thickness of about 20 nm or less. In one embodiment, the thickness may be between about 0.3 nm and about 5 nm. In another embodiment, the thickness may be between about 0.4 nm and about 3 nm. In another embodiment, the thickness may be between about 0.5 nm and about 2 nm. The silicon, silicon germanium, or metal deposits on top of the near surface region 605 and due to the surface energy of the silicon, silicon germanium, or metal and the top of the near surface region 605. The silicon, silicon germanium, or metal atoms coalesce into hemispheres, such as the nanocrystals 607. The formed nanocrystals 607 may have a grain diameter between about 0.5 nm and about 20 nm. In another embodiment, the diameter may be between about 0.5 nm and about 10 nm. In another embodiment, the diameter may be between about 0.5 nm and about 2 nm. The nanocrystals 607 may be spaced such that the nanocrystals are separated from each other with a distance of at least about 0.5 nm. In one embodiment, the distance may be at least 1 nm.

The nanocrystals formed may contain silicon, silicon germanium, or at least one metal, such as platinum, palladium, nickel, iridium, ruthenium, cobalt, tungsten, tantalum, molybdenum, rhodium, alloys thereof, or combinations thereof. In one embodiment, the nanocrystalline material comprises platinum, nickel, ruthenium, platinum-nickel alloy, or combinations thereof.

In general, for the metal nanocrystal deposition, PVD can be done with solid metallic targets and argon plasmas. PVD, CVD or ALD can be used, where the substrate may be maintained at a temperature less than about 300 degrees Celsius at a process chamber pressure between about 1 Torr to about 10 Torr. In one embodiment where a constant carrier gas flow is desired, a carrier gas stream is established within the process chamber. Carrier gas may be selected so as to also act as a purge gas for the removal of volatile reactants and/or by-products from the process chamber. Carrier gases such as, for example, helium (He) and argon (Ar), and combinations thereof, among others may be used. After the carrier gas stream is established within the process chamber, a pulse of a metal-containing precursor is added to the carrier gas stream. The term pulse as used herein refers to a dose of material injected into the process chamber or into the carrier gas stream. The pulse of the noble metal-containing precursor lasts for a predetermined time interval.

The metal-containing precursor may comprise, for example, metals such as palladium, platinum, cobalt, nickel, and rhodium, ruthenium, among others. Suitable palladium-containing precursors include bis(allyl)palladium, bis(2-methylallyl)palladium, and (cyclopentadienyl)(allyl)palladium, among others. Suitable platinum-containing precursors include trimethyl (cyclopentadienyl)platinum, trimethyl(methylcyclopentadienyl)platinum, cyclopentadienyl(allyl) platinum, dimethyl(cyclooctadiene)platinum, methyl(carbonyl)cyclopentadienylplatinum, trimethyl(acetylacetonato) platinum, and bis(acetylacetonato)platinum, among others.

Suitable cobalt-containing precursors include (cyclopentadienyl)(cyclohexadienyl)cobalt, (cyclobutadienyl)(cyclopentadienyl)cobalt, bis(cyclopentadienyl)cobalt, bis(methylcyclopentadienyl)cobalt, cyclopentadienyl(1,3-hexadienyl) cobalt, (cyclopentadienyl)(5-methylcyclopentadienyl) cobalt, and bis(ethylene) (pentamethylcyclopentadienyl) cobalt, among others. A suitable nickel-containing precursor includes bis(methylcyclopentadienyl) nickel, among others. Suitable rhodium-containing precursors include bis(propylene)rhodium, bis-(carbonyl)(cyclopentadienyl)rhodium, bis (carbonyl)(methylcyclopentadienyl)rhodium, and bis(carbonyl) (ethylcyclopentadienyl)rhodium, among others.

Suitable ruthenium-containing precursors include tris(2,2, 6,6-tetramethyl-3,5-hepta-nedionato)ruthenium, bis(2,4-dimethylpentadienyl)ruthenium, dicarbonyl pentadienyl ruthenium, ruthenium acetyl acetonate, (2,4-dimethylpentadienyl)ruthenium(cyclopentadienyl), bis(2,2,6,6-tetramethyl-3,5-heptanedionato)ruthenium(1,5-cyclooctadiene), (2,4-dimethylpentadienyl)-ruthenium(methylcyclopentadienyl), (1,5-cyclooctadiene)ruthenium-(cyclopentadienyl), (1,5-cyclooctadiene)ruthenium(methylcyclopentadienyl), (1,5-cyclooctadiene)ruthenium(ethylcyclopen-tadienyl), (2,4-dimethylpentadienyl)ruthenium(ethylcyclopentadienyl), (2,4-dimethylpentadienyl)-ruthenium(isopropylcyclopentadienyl), bis(N,N-dimethyl-1,3-tetramethyl diiminato) ruthenium(1,5-cyclooctadiene), bis(N,N-dimethyl-1,3-dimethyl diiminato)ruthenium(1,5-cyclooctadiene), bis (allyl)ruthenium(1,5-cyclooctadiene), (.eta..sup. 6-C.sub. 6H.sub. 6)ruthenium(1,3-cyclohexadiene), bis(1,1-dimethyl-2-aminoethoxylato)ruthenium(1,-5-cyclooctadiene), bis(1, 1-dimethyl-2-amino-ethylaminato)ruthenium(1,5-cyclooctadiene), and combinations thereof.

The time interval for the pulse of the metal-containing precursor is variable depending upon a number of factors such as, for example, the volume capacity of the process chamber employed, the vacuum system coupled thereto and the volatility/reactivity of the reactants used. For example, a large-volume process chamber may lead to a longer time to stabilize the process conditions such as, for example, carrier/ purge gas flow and temperature, requiring a longer pulse time. A lower flow rate for the process gas may also lead to a longer time to stabilize the process conditions requiring a longer pulse time. A lower chamber pressure means that the process gas is evacuated from the process chamber more quickly requiring a longer pulse time. In general, the process conditions are advantageously selected so that a pulse of the metal-containing precursor provides a sufficient amount of precursor so that at least a monolayer of the metal-containing nanocrystals are adsorbed on the substrate. Thereafter, excess noble metal-containing precursor remaining in the chamber may be removed from the process chamber by the constant carrier gas stream in combination with the vacuum system.

In one embodiment, the nanocrystals 607 comprise silicon hemispheres. In one embodiment, a POLyGEN LPCVD chamber, available from Applied Materials, Inc., located in Santa Clara, Calif., may be used for the deposition. The deposition temperature of the chamber may be between about 300 degrees Celsius and about 800 degrees Celsius. The deposition pressure of the chamber may be set to a pressure between about 10 Torr and about 350 Torr. In one embodiment, the temperature may be between about 500 degrees Celsius and about 700 degrees Celsius, and a pressure may be between about 30 Torr and about 350 Torr.

The silicon source (i.e., precursor) may be a gas such as silane ($SiH_4$), or alternatively other silicon source gases such as disilane ($Si_2H_6$), trisilane ($Si_3H_8$), and bis-tertiarybutylamino silane (BTBAS, ($C_8H_{22}N_2Si$)). Additionally, a carrier gas may be included that includes $H_2$ and an inert gas (e.g., nitrogen, helium, argon). In one example, silane is fed into the chamber between about 50 sccm to about 150 sccm, while the deposition temperature in chamber is maintained at a steady temperature between about 440 degrees Celsius and about 490 degrees Celsius and a deposition pressure between about 150 Torr and about 350 Torr. In one embodiment, the partial pressure for silane may be between about 0.5 Torr to about 3.5 Torr.

For disilane, this silicon precursor gas may be fed into the chamber between about 50 sccm and about 150 sccm, while the deposition temperature in the chamber is maintained at a steady temperature between about 425 degrees Celsius and about 475 degrees Celsius, and a deposition pressure of between about 30 Torr and about 225 Torr. The partial pressure of the disilane precursor may be between about 0.1 Torr to about 3.0 Torr. For trisilane, this precursor gas is fed into the chamber between about 200 sccm to about 350 sccm, while the deposition temperature in the chamber is maintained at a steady temperature that is between about 400 degrees Celsius and about 450 degrees Celsius, and a deposition pressure of about 30 Torr to about 200 Torr. The partial pressure of the trisilane precursor may be between about 0.1 Torr to about 2.5 Torr.

The thermal energy from a susceptor and the substrate disposed within the chamber causes the silicon source gas to thermally decompose and deposit a discontinuous and amorphous nanocrystal silicon film on the near surface region 605. Although FIG. 6C is illustrated in a simplified form for clarity of explanation, the layer of nanocrystal silicon, in one embodiment, may have a density of greater than about $1 \times 10^{10}$ crystal/$cm^2$ and an average grain diameter of about 5 nanometers. In one embodiment of the present invention, only thermal energy is used to decompose the silicon source gas without the aid of additional energy sources such as plasma or photon enhancement.

In one embodiment of the present invention, the deposition pressure, temperature, and process gas flow rates and concentration are chosen so that a nanocrystal silicon film is deposited at a deposition rate in the range between about 0.5 nm/min and about 1.5 nm/min. The deposition rate may depend on the process chemistry, temperature, or pressure. For example, silane may be deposited at a rate of about 0.5 nm/min based on a deposition temperature between about 440 degrees Celsius and about 490 degrees Celsius, a deposition pressure between about 150 Torr and about 350 Torr, and a partial pressure of about 0.5 Torr to about 3.5 Torr. The process gas mix is continually fed into the chamber until a film comprising nanocrystals 607 of a desired thickness is formed.

In optional step 512, a post nanocrystal deposition anneal may be performed. The anneal may be performed in RTP chamber 300 where the substrate is subjected to a temperature of between about 500 degrees Celsius and about 1,200 degrees Celsius. In one embodiment, the temperature may be between about 900 degrees Celsius and about 1,100 degrees Celsius. In another embodiment, the anneal may occur at a temperature of less than about 600 degrees Celsius. The anneal may be performed for a time period between about 1 second and about 240 seconds. In one embodiment, the time period may be between about 30 seconds and about 90 seconds. In one embodiment, the anneal may occur at about 1,000 degrees Celsius for about 60 seconds. Generally, RTP anneal chamber atmosphere contains at least one anneal gas, such as $O_2$, $N_2$, $NH_3$, $N_2H_4$, NO, $N_2O$, or combinations thereof. The anneal chamber may be maintained at a pressure from about 5 Torr to about 100 Torr, for example, at about 50 Torr.

Figure 6D:
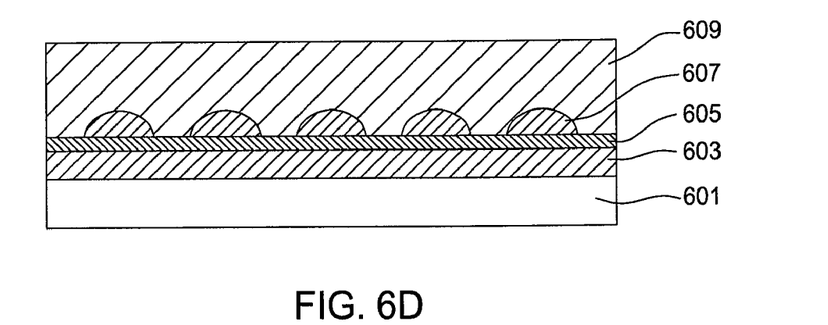

In step 514, the encapsulating dielectric layer 609 is deposited to encapsulate the nanocrystals 607. Encapsulating dielectric layer 609 may be deposited by a vapor deposition process, such as ALD, CVD, PVD, thermal techniques or combinations thereof. In certain embodiments, the encapsulating dielectric layer 609 may be a high-k dielectric layer deposited by ALD processes and apparatuses. Encapsulating dielectric layer 609 is generally deposited with a film thickness in a range between about 0.5 nm and about 30 nm. In one embodiment, the thickness may be between about 1 nm and about 20 nm. In another embodiment, the thickness may be between about 4 nm and about 10 nm.

Encapsulating dielectric layer 609 is deposited on the substrate surface and may have a variety of compositions that are homogenous, heterogeneous, graded and/or multiple layered stacks or laminates. Encapsulating dielectric layer 609 is generally a high-k dielectric material and may include combinations of hafnium, zirconium, titanium, tantalum, lanthanum, aluminum, silicon, oxygen and/or nitrogen. Encapsulating dielectric layer 609 may have a composition that includes hafnium-containing materials, such as hafnium oxides ($HfO_x$ or $HfO_2$), hafnium silicates ($HfSi_xO_y$ or $HfSiO_4$), hafnium silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium-containing materials, such as zirconium oxides ($ZrO_x$ or $ZrO_2$), zirconium silicates ($ZrSi_xO_y$ or $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), derivatives thereof and combinations thereof. Other dielectric materials useful for the high-k dielectric layer may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for the high-k dielectric layer include $HfO_2/Al_2O_3$, $HfO_2/SiO_2$, $La_2O_3/Al_2O_3$ and $HfO_2/SiO_2/Al_2O_3$.

In certain embodiments, the ALD process is conducted in a process chamber, for example, process chamber 300, at a pressure in the range from about 1 Torr to about 100 Torr. In one embodiment, the pressure may be from about 1 Torr to about 20 Torr. In another embodiment, the pressure may be from about 1 Torr to about 10 Torr. The temperature of the substrate may be maintained in the range from about 70 degrees Celsius to about 1,000 degrees Celsius. In one embodiment, the temperature may be from about 100 degrees Celsius to about 650 degrees Celsius. In another embodiment, the temperature may be from about 250 degrees Celsius to about 500 degrees Celsius. In certain embodiments, a hafnium precursor may be introduced into the process chamber at a rate in the range from about 5 sccm to about 200 sccm. The hafnium precursor may be introduced with a carrier gas, such as nitrogen, with a total flow rate in the range from about 50 sccm to about 1,000 sccm. The hafnium precursor may be pulsed into the process chamber at a rate in a range from about 0.1 seconds to about 10 seconds, depending on the particular process conditions, hafnium precursor, or desired composition of the deposited hafnium-containing material. In certain embodiments, the hafnium precursor may be pulsed into the process chamber at a rate in a range from about 1 second to about 5 seconds. In one embodiment, the rate may be about 3 seconds.

In certain embodiments, the hafnium precursor is pulsed into the process chamber at a rate in a range from about 0.1 seconds to about 1 second. In one embodiment, the rate may be about 0.5 seconds. In one embodiment, the hafnium precursor may be hafnium tetrachloride ($HfCl_4$). The pulses of a purge gas, such as argon or nitrogen, may be introduced at a flow rate in a range from about 2 slm to about 22 slm. In one embodiment, the rate may be about 10 slm. Each processing cycle occurs for a time period in a range from about 0.01 seconds to about 20 seconds. In one embodiment, the process cycle lasts about 10 seconds. In another embodiment, the process cycle lasts about 2 seconds. Longer processing steps lasting about 10 seconds deposit excellent hafnium-containing films, but reduce the throughput. The specific purge gas flow rates and duration of process cycles are obtained through experimentation. In one embodiment, a 300 mm diameter wafer requires about twice the flow rate for the same duration as a 200 mm diameter wafer in order to maintain similar throughput. An oxidizing gas is introduced to the process chamber with a flow a rate in the range from about 0.1 sccm to about 1,000 sccm. In one embodiment, the rate may be from about 0.5 sccm to about 100 sccm. The oxidizing gas may be pulsed into process chamber at a rate in a range from about 0.1 seconds to about 20 seconds. In another embodiment, the rate may be from about 0.2 seconds to about 10 seconds. In another embodiment, the rate may be from about 0.5 seconds to about 5 seconds. In one embodiment, the oxidizing gas is pulsed at a rate in a range from about 1 second to about 5 seconds. In another embodiment, the rate may be about 1.7 seconds. In another embodiment, the oxidizing gas may be pulsed at a rate in a range from about 0.1 seconds to about 3 seconds. In another embodiment, the rate may be about 0.5 seconds.

Figure 6E:
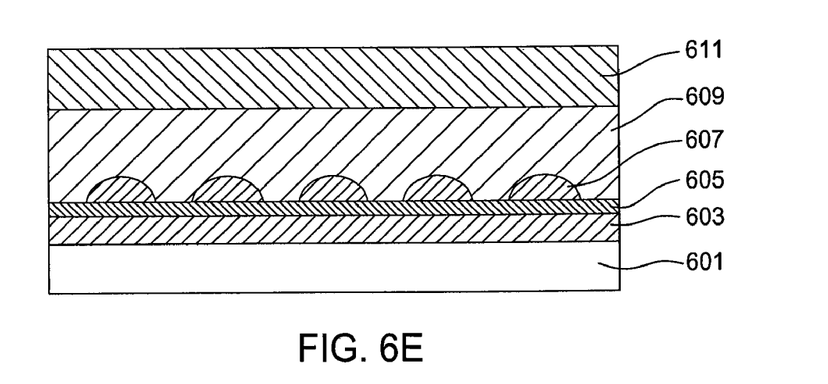

At step 516, a control gate layer 611 is deposited on the encapsulating dielectric 609. The control gate layer 611 may be a polysilicon layer which can be formed in a deposition chamber such as the LPCVD deposition chamber 214A or the ALD chamber 214B of the integrated processing system 200 (FIG. 2). Instead of polysilicon, the control gate layer 611 may be an amorphous silicon film or other suitable conductive material. Further, metals such as titanium, titanium nitride, tantalum, tantalum nitride, tungsten, tungsten nitride, and other refractory metals or other suitable electrode materials may be deposited thereover. After the formation of the control gate layer 611, the gate stack may be transferred to a cool down chamber and then transferred to a storage area such as the load lock 204 and 206 for further processing, testing, or other processes known in the art.

It is to be appreciated that the gate stack that includes the gate dielectric film, the plasma treated gate dielectric film surface, nanocrystals, encapsulating dielectric, and the polysilicon cap film can be formed in several processing chambers not necessarily incorporated into the integrated processing system 200 previously described.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
   depositing a tunnel oxide layer on a substrate;
   exposing the tunnel oxide layer to a plasma consisting essentially of an inert gas, wherein the plasma alters a morphology of a surface and near surface of the tunnel oxide to form a plasma altered surface and a plasma altered near surface; and
   depositing nanocrystals on the plasma altered surface of the tunnel oxide.

2. The method of claim 1, further comprising depositing an encapsulating dielectric material on the substrate.

3. The method of claim 2, further comprising depositing a control gate material on the substrate.

4. The method of claim 3, wherein the tunnel oxide layer is deposited to a thickness between about 1 nm and about 10 nm.

5. The method of claim 4, wherein the plasma altered near surface has a thickness between about 0.2 nm and about 2 nm.

6. The method of claim 5, wherein the plasma altered near surface has a thickness of about 1 nm.

7. The method of claim 5, wherein the exposing the tunnel oxide layer to a plasma comprises applying a pulsed RF field to a plasma gas while maintaining an ion energy less than about 15 eV.

8. The method of claim 7, wherein the plasma gas is selected from the group consisting of argon, helium, neon, xenon, and combinations thereof.

9. The method of claim 7, further comprising annealing the substrate before at least one of the depositing nanocrystals and the depositing an encapsulating dielectric material.

10. The method of claim 7, wherein ion energy is less than about 5 eV.

11. The method of claim 5, wherein the tunnel oxide comprises silicon dioxide.

12. The method of claim 11, wherein the nanocrystals comprise at least one of silicon, platinum, palladium, nickel, iridium, ruthenium, cobalt, tungsten, tantalum, molybdenum, and rhodium.

13. A method of fabricating a non-volatile memory device, comprising:
   depositing a tunnel oxide layer on a substrate;
   exposing the tunnel oxide layer to a plasma consisting essentially of an inert gas by applying a pulsed RF field to a plasma gas while maintaining an ion energy less than about 5 eV, wherein the plasma alters a morphology of a surface and near surface of the tunnel oxide;
   depositing at least one of silicon nanocrystals and metal nanocrystals on the surface of the tunnel oxide after the exposing the tunnel oxide layer;
   depositing an encapsulating dielectric material on the substrate to encapsulate the at least one of silicon nanocrystals and metal nanocrystals;
   depositing a control gate material on the substrate; and annealing the substrate before at least one of the depositing nanocrystals and the depositing an encapsulating dielectric material.

14. The method of claim 13, wherein the tunnel oxide layer is deposited to a thickness between about 1 nm and about 10 nm.

15. The method of claim 14, wherein the plasma altered near surface has a thickness between about 0.2 nm and about 2 nm.

16. The method of claim 15, wherein the plasma altered near surface has a thickness of about 1 nm.

17. The method of claim 13, wherein the plasma gas is selected from the group consisting of argon, helium, neon, xenon, and combinations thereof.

18. The method of claim 13, wherein the tunnel oxide comprises silicon dioxide.

19. The method of claim 18, wherein the nanocrystals comprise at least one of silicon, platinum, palladium, nickel, iridium, ruthenium, cobalt, tungsten, tantalum, molybdenum, and rhodium.

* * * * *